(12) United States Patent
Sato et al.

(10) Patent No.: US 8,416,575 B2
(45) Date of Patent: Apr. 9, 2013

(54) ELECTRICAL CONNECTION BOX

(75) Inventors: Hisashi Sato, Kakegawa (JP); Yuichi Ishida, Kakegawa (JP); Masaaki Ishiguro, Kakegawa (JP); Kazuaki Nakamura, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 832 days.

(21) Appl. No.: 11/755,076

(22) Filed: May 30, 2007

(65) Prior Publication Data

US 2007/0279870 A1 Dec. 6, 2007

(30) Foreign Application Priority Data

May 30, 2006 (JP) .............................. P2006-149981

(51) Int. Cl.
*H05K 7/20* (2006.01)
(52) U.S. Cl. ........ 361/720; 361/637; 361/709; 361/752; 361/762; 174/260; 439/76.2
(58) Field of Classification Search .................. 361/600, 361/704, 611, 624, 637, 641, 648, 676, 679.46, 361/709, 710, 711–715, 719–722, 748–753, 361/756–761; 439/76.1–76.2, 100; 174/59, 174/100
See application file for complete search history.

(56) References Cited

U.S. PATENT DOCUMENTS

| | | | | |
|---|---|---|---|---|
| 6,315,578 B1 * | 11/2001 | Kasai et al. | .................. | 439/76.2 |
| 6,447,325 B1 * | 9/2002 | Yamane et al. | ............... | 439/404 |
| 6,796,808 B2 * | 9/2004 | Hosoe et al. | .................. | 439/76.2 |
| 6,875,962 B2 * | 4/2005 | Uhl et al. | ........................ | 219/530 |
| 7,172,436 B2 * | 2/2007 | Uezono | ........................ | 439/76.2 |
| 7,283,366 B2 * | 10/2007 | Yamashita | .................... | 361/719 |
| 7,286,338 B2 * | 10/2007 | Yamashita | .................... | 361/622 |
| 7,505,283 B2 * | 3/2009 | Naimi et al. | .................. | 361/761 |
| 2004/0007379 A1 * | 1/2004 | Suzuki et al. | ................... | 174/59 |

FOREIGN PATENT DOCUMENTS

| | | |
|---|---|---|
| JP | 3-91016 U | 9/1991 |
| JP | 2001-119838 A | 4/2001 |
| JP | 2006-019711 A | 1/2006 |

OTHER PUBLICATIONS

English Translation of Japanese Office Action issued Jul. 6, 2010 in corresponding Japanese Application No. 2006-149981.

* cited by examiner

*Primary Examiner* — Courtney Smith
(74) *Attorney, Agent, or Firm* — Sughrue Mion, PLLC

(57) ABSTRACT

An electrical component is mounted a circuit board. A case covers the circuit board. The circuit board includes a plate-like metal core and an insulation portion. The insulation portion covers a surface of the metal core. The metal core is provided with a heat radiation portion exposed from the case.

7 Claims, 5 Drawing Sheets

ELECTRICAL CONNECTION BOX

BACKGROUND

The present invention relates to an electrical connection box for housing a circuit board on which an electrical circuit such as a power supply circuit is mounted.

In general, a circuit board including an electrical circuit such as a power supply circuit is installed in a vehicle with a box housing the circuit boards. In this case, when the circuit board includes a large-current electrical circuit such as a power supply circuit having a large calorific value, the radiation performance of the box should be enough large.

As a countermeasure for radiating the heat produced from the large-current electrical circuit, a related-art electrical connection box hag a cooling structure is provided (for example, Japanese Patent Publication No. 2001-119838A).

As shown in FIG. 5, in the related-art electrical connection box, a plurality of substrates 2 having a metal core is housed within a housing including a plurality of cases 1. The related-art electrical connection box has a structure in which a heat radiation fin 5 is attached to a printed substrate 2 through a thermal conductive insulation sheet 3 and a metal spacer 4 which are interposed therebetween, a heat pipe 6 is attached to the printed substrate 2 through the thermal conductive insulation sheet 3 interposed therebetween, and the heat pipe 6 is connected to a body panel of a vehicle, thereby radiating heat from the housing.

However, in the related-art electrical connection box, since it is necessary to connect the heat pipe 6 to the body panel of the vehicle so as to radiate heat from the housing, the attaching position in the vehicle is limited.

Since the thermal conductive insulation sheet 3, the radiation fin 5 having a complicated shape, and the heat pipe 6 are needed for the radiation structure, the structure size is increased, thereby causing an increase in size of the electrical connection box and a rise in cost.

When the electrical connection box is dismantled, the thermal conductive insulation sheet 3, the radiation fin 5, and the heat pipe 6 should be detached from the substrate 2. As a result, a great effort is required for the dismantling.

SUMMARY

It is therefore an object of the invention to provide, at low cost, an electrical connection box having superior soaking and radiation performance, improving recycling efficiency and capable of reducing the size and weight without limiting the attaching position.

In order to attain the above object, according to the invention, there is provided an electrical connection box, comprising:

a circuit board, on which an electrical component is mounted; and
   a case, covering the circuit board;
   the circuit board including:
   a plate-like metal core; and
   an insulation portion, covering a surface of the metal core; and
   the metal core is provided with a heat radiation portion exposed from the case.

With this configuration, heat transferred from the electric component to the metal core can be effectively radiated from the heat radiation portion. As a result, it is not necessary to provide the thermal conductive insulation sheet, the radiation fin, or the heat pipe with the electrical connection box ad it is possible to supply large current into the circuit board without using a bus bar. Therefore, the structure can be dismantled, and then it is possible to reduce the size and weight and to save the cost. It is also possible to easily dismantle the structure, without limiting the attaching position.

The heat radiation portion may be integrally formed on a part of the metal core which is exposed from the insulation portion.

With this configuration, the heat transferred from the metal core can be desirably radiated from the heat radiation portion to the exterior. Further, since a part of the metal core serves as the heat radiation portion, it is possible to obtain a simplified structure and an improved recycling efficiency.

The heat radiation portion may be connected to a part of the metal core which is exposed from the insulation portion.

With this configuration, the heat transferred from the metal core can be desirably radiated from the heat radiation portion to the exterior. Furthermore, since the heat radiation portion is simply connected to the metal core, it is possible to obtain a simplified structure and an improved recycling efficiency.

The heat radiation portion may be configured to be connectable to a heat radiation member.

With this configuration, since the heat radiation member can be connected to the heat radiation portion, the heat radiation effect can be much improved.

The case includes a socket which may be configured to be connectable to a connector;
   the heat radiation portion may be disposed in the socket;
   the heat radiation member may be disposed in the connector;
   the heat radiation member may be connected to the heat radiation portion by connecting the connector to the socket so as to transfer heat from the heat radiation portion to the heat radiation member.

With this configuration, since the connector can be connected to the socket to enable the heat radiation portion to transfer the heat to the heat radiation member, further heat radiation effect can be obtained due to the heat radiation member. In addition, with this configuration, the heat radiation member can be provided to the space within the connector not occupied by an electrical wire and can be connected with the heat radiation portion. As a result, since it is not necessary to provide any separate space for heat radiation, the space can be effectually utilized and a simplified structure and reduction in size and weight can be obtained.

According to the invention, it allows obtaining superior soaking and radiation performance, and improving recycling efficiency, and also it permits reduction in size and weight and cost-saving, without limiting the attaching position.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Hereinafter, an embodiment of an electrical connection box according to the invention will be discussed with reference to the accompanying drawings.

Figure 1:
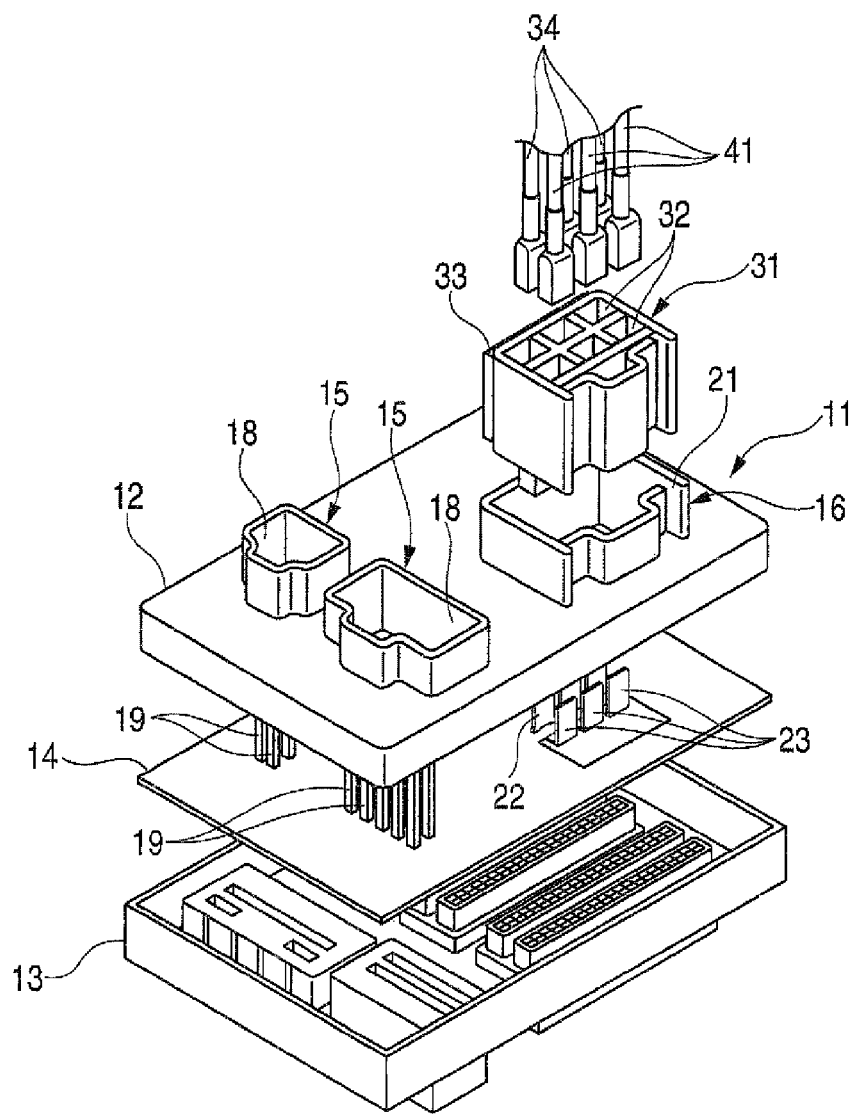
FIG. 1 is an exploded perspective view showing the structure of the circuit board according to an embodiment of the invention.

As shown in FIG. 1, the electrical connection box 11 has an upper case (case) 12 and a lower case (case) 13. The circuit board 14 is disposed between the upper case 12 and the lower case 13. The circuit board 14 is covered with the upper case 12 and the lower case 13. The wiring pattern (not shown) is formed on the both faces of the circuit board 14. For example, the electrical components (not shown), such as relays, fuses, electronic control units are mounted on the circuit board 14.

The upper case 12 and the lower case 13 are formed by, for example, polypropylene that the glass fiber is incorporated into. The upper case 12 and the lower case 13 are combined together, in a state that the circuit board 14 is sandwiched between the upper case 12 and the lower case 13.

The electrical connection box 11 has a plurality of socket 15 connectable with connectors of the wiring harness, and a socket (socket) 16 having a heat radiation capacity.

The socket 15 has an engaging concave portion 18 formed in the upper case 12. A connection terminal 19 is arranged within the engaging concave portion 18, which is uprightly provided so as to electrically connect to the wing pattern of the circuit board 14. In addition, in the socket 15, a connector of the wiring harness is engaged with the engaging concave portion 18, and then the terminal of the connector is electrically connected to the connection terminal 19 of the socket 15.

Like the socket 15, the socket 16 having a heat radiation function also has an engaging concave portion 21 formed in the upper case 12. A heat radiation terminal 23 (heat radiation section) and a connection terminal 22 uprightly provided to the circuit board 14 are disposed within the engaging concave portion 21 and are exposed from the upper case 12.

Furthermore, in the socket 16 having the heat radiation function, the connector (connector) 31 of wiring harness having a heat radiation function is engaged with the engaging concave portion 21.

Figure 2:
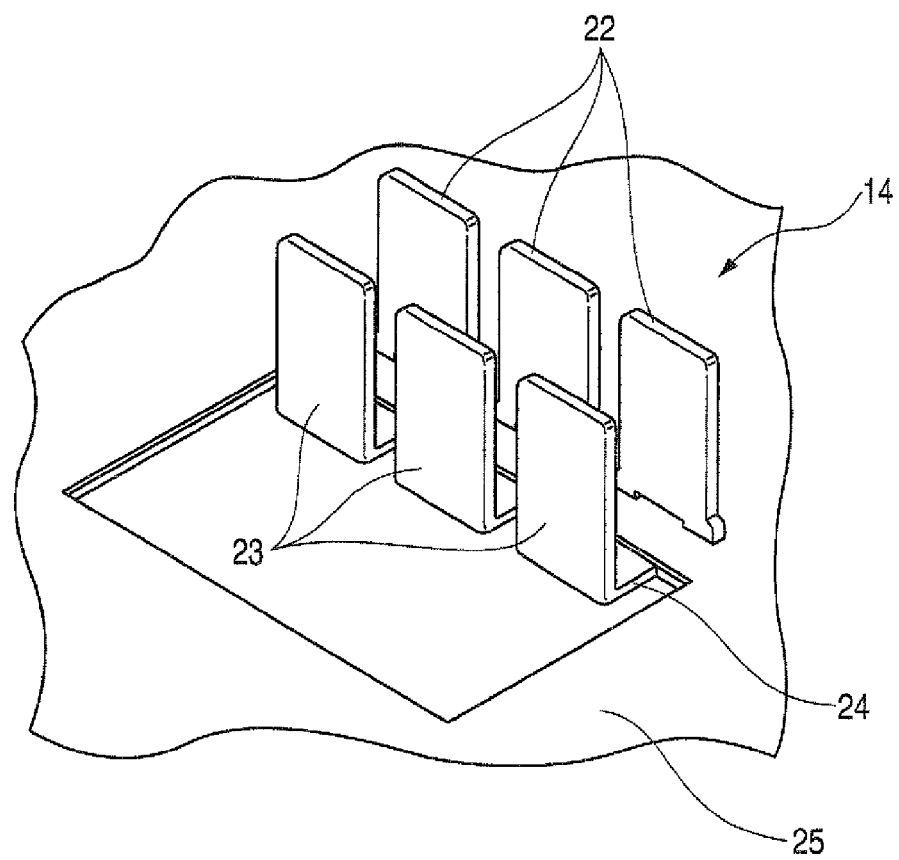
FIG. 2 is a perspective view showing a part of the circuit board.
Figure 3:
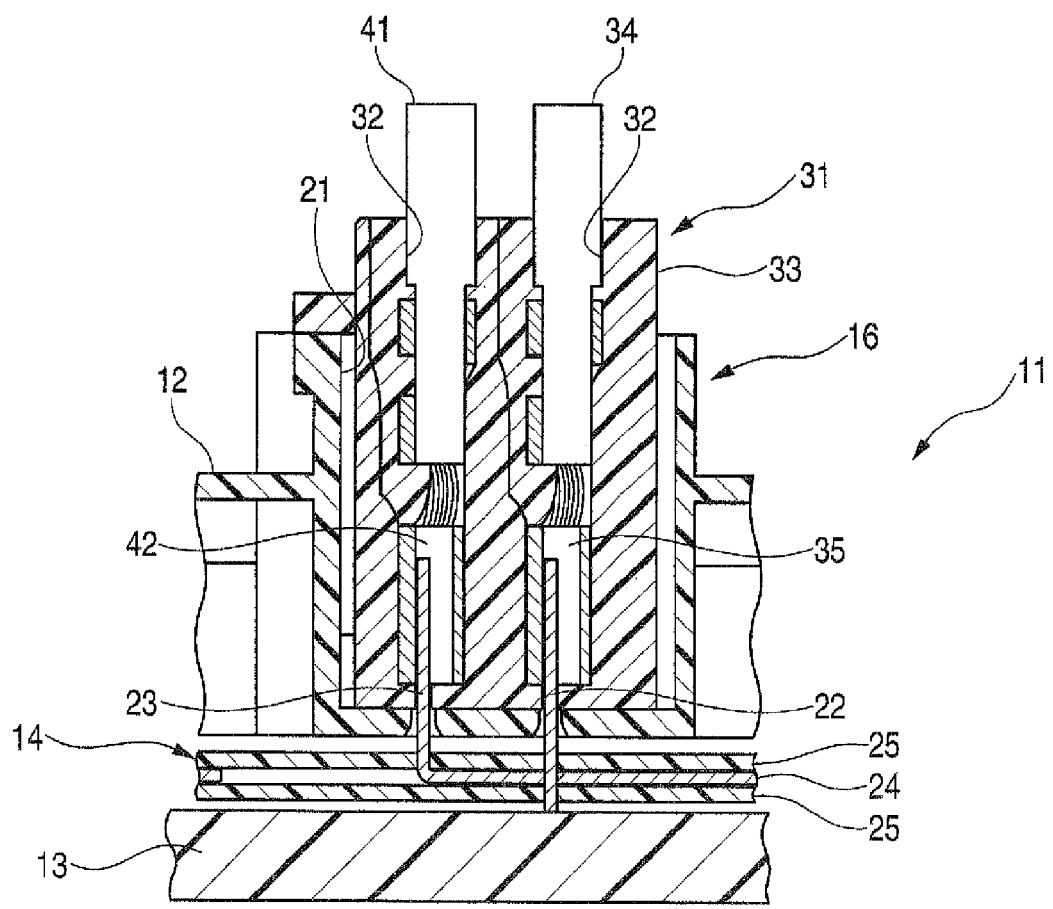
FIG. 3 is a section view showing the structure of the socket having a heat radiation capacity.

As shown in FIGS. 2 and 3, the connection terminal 22 and the heat radiation terminal 23 are provided so as to extend uprightly from the circuit board 14.

In this case, the circuit board 14 is a metal core substrate, and has the plate-like metal core 24 and the insulation section 25 formed so as to cover the surface of the metal core 24. The circuit board 14 is an electrical circuit board that the metal core 24 and the insulation section 25 are multilayered.

The metal core 24 is, for example, a plate made of copper. The insulation section 25 is formed by molding glass epoxy resin, etc. having nonconductive property and low heat conductivity. In addition, instead of the copper, aluminum that spec gravity is about one third of copper may be employed as the material of the metal core 24.

On the circuit board 14 made of the metal core substrate, the conductive circuit pattern (not shown) made of copper foil is formed in the insulation section 25.

The heat radiation terminal 23 is provided in such a manner that the insulation section 25 in a part of the circuit board 14 is eliminated to expose the metal core 24, and a part of the exposed metal core 24 is formed in a terminal shape and then bent.

The connector 31 having the heat radiation function which is connected to the socket 16 having the heat radiation function, has housing 32 having a plurality of terminal holding holes 32. A wiring terminal 35 connected to a circuit wire 34 and a heat conduction terminal 42 connected to a heat conduction member are housed within the terminal holding hole 32.

In addition, when the connector 31 having the heat radiation function is connected to the engaging concave portion 21 of the socket 16 having a heat radiation capacity in the electrical connection box 11 by inserting the housing 33, the wiring terminal 35 is connected to the connection terminal 22 and simultaneously the heat conduction terminal 42 is connected to the heat radiation terminal 23.

Moreover, in the electrical connection box 11 having the aforementioned structure, the heat transferred from the electrical component mounted on the circuit board 14 is transferred to the metal core 24 of the circuit board 14, subsequently transferred to the heat radiation member 41 via the heat radiation terminal 23 which is a part of the metal core 24 and the heat conduction terminal 42 of the connector 31 having the heat radiation function, and then radiated from the heat radiation member 41 to the exterior.

In a case that the connector 31 is separated, the heat is directly radiated from the heat radiation terminal 23.

Thus, according to the electrical connection box regarding to the embodiment, since the metal core 24 of the circuit board 14 is provided with the heat radiation terminal 23 and the heat radiation terminal 25 is exposed to the exterior, the heat of the electrical component transferred to the metal core 24 can be surely radiated from the heat radiation terminal 23 with insulating with interconnections such as the connection terminal 22. As a result, it is not necessary to provide the thermal conductive insulation sheet, the radiation fin or the heat pipe with the electrical connection box and it allows supplying large current into the circuit board without using bus bar. Further, due to the simplification of the structure, it allows reduction in size and weight, and cost-saving. It also permits easy dismantlement, without limiting the attaching position. Therefore, the soaking and radiation performance, and recycling efficiency can be much improved.

Further, by extending and connecting the heat radiation member 23 to the body panel of vehicle, heat radiation to the exterior can be easily performed.

In particular, since the heat radiation terminal 23 is formed by bending a portion of the metal core 24, much simplified structure and more improved recycling efficiency can be obtained.

Further, by connecting the connector 31 having the heat radiation function to the socket 16 having the heat radiation function, the heat radiation member 41 can be connected to the heat radiation terminal 23 so as to transfer the heat thereto, and the heat radiation effect can be improved due to the heat radiation member 41. Additionally, the heat radiation member 41 can be provided in the space within the connector 31 having the heat radiation function, not occupied by an electrical wire and can be connected with the heat radiation terminal 23. As a result, since it is not necessary to provide any additional space for heat radiation, the space can be effectually utilized and much more simplified structure and reduction in size and weight can be obtained.

Figure 4:
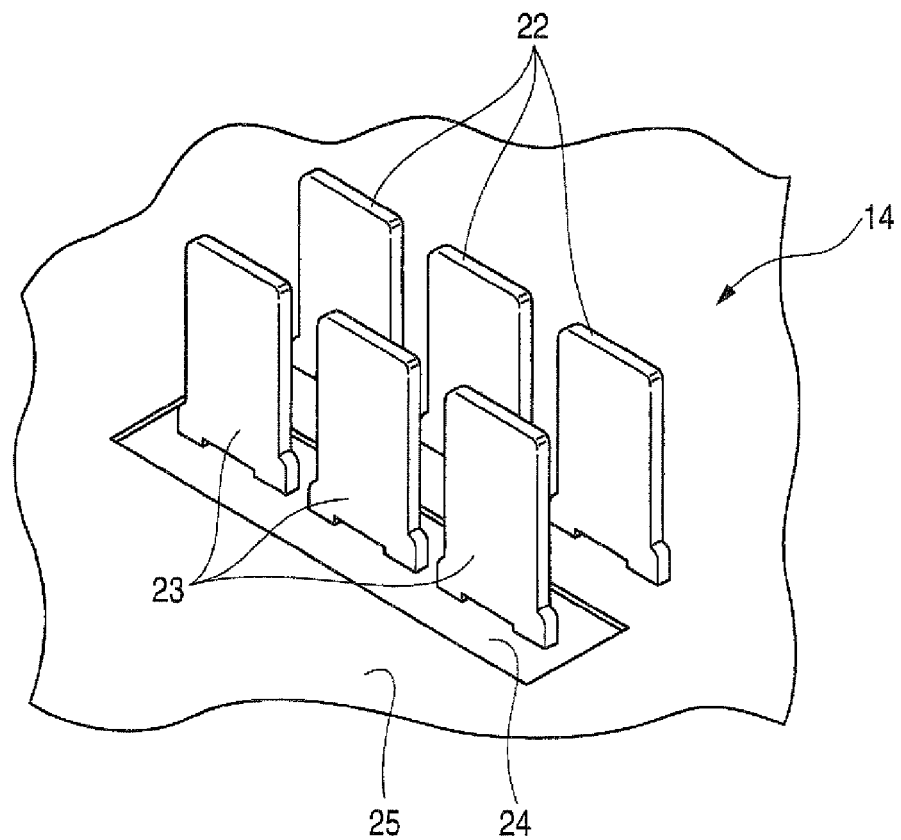
FIG. 4 is a perspective view showing a part of the circuit board.
Figure 5:
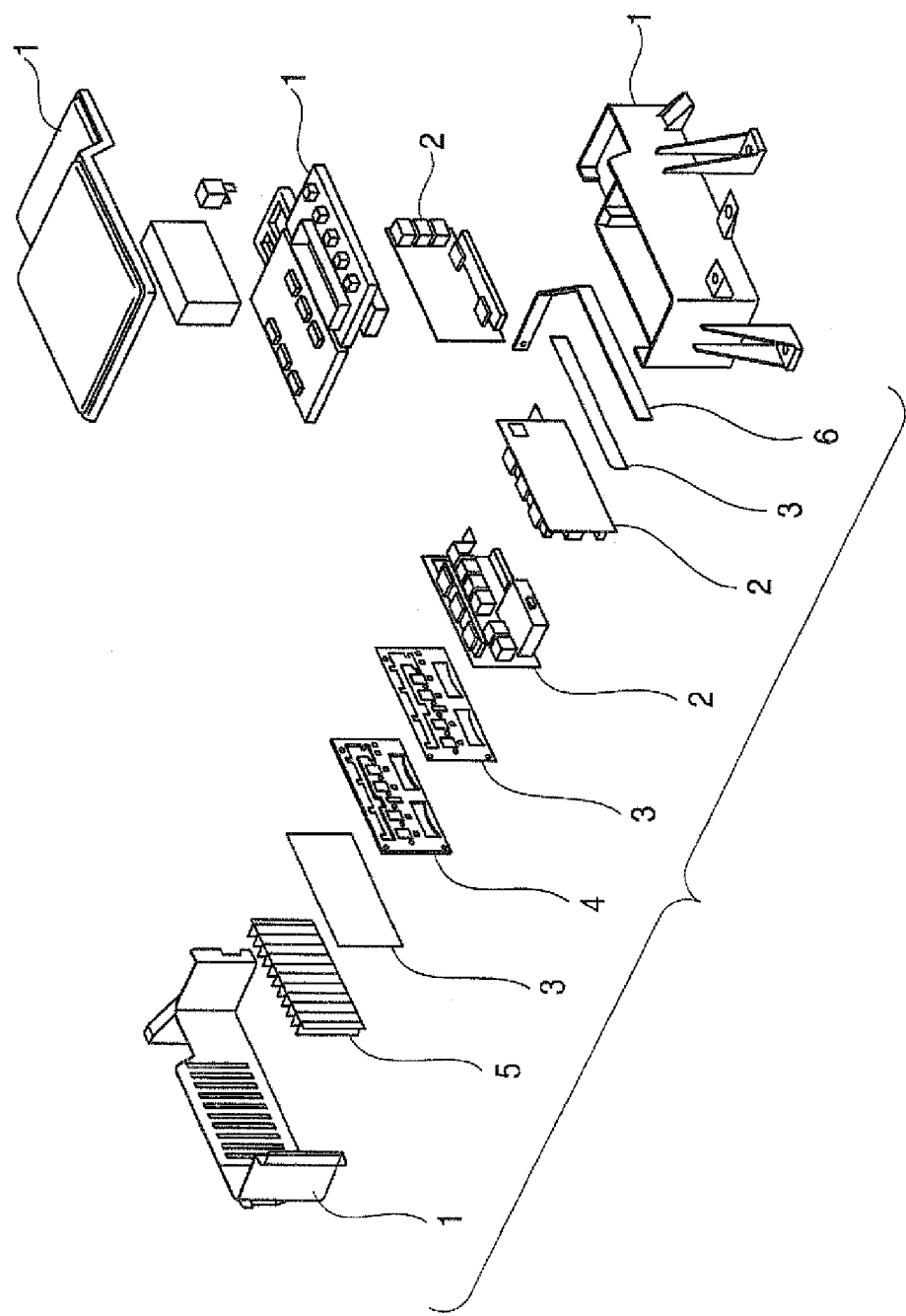
FIG. 5 is an exploded perspective view showing a related-art electrical connection box.

While in the aforementioned embodiment, the heat radiation terminal 23 is formed by exposing and then bending a portion of the metal core 24 which makes up of the circuit board 14, the heat radiation terminal 23 separated from the metal core 24 may be connected to the metal core 24 of the circuit board 14 as shown in FIG. 4.

In this case, the heat can be desirably radiated from the heat radiation terminal 23 uprightly provided and connected to the metal core 24. Further, since the heat radiation section is formed by simply connecting the heat radiation terminal 23 to the metal core 24, it allows simplifying structure and more improving the recycling efficiency.

What is claimed is:

1. An electrical connection box, comprising:
   a printed circuit board, on which an electrical component is mounted; and
   a case, covering the circuit board;
   wherein the circuit board includes:
   a plate-like metal core;
   an insulation portion, covering both surfaces of the metal core;
   a circuit pattern made of copper foil, formed on the insulation portion;
   an electrical connection portion which is electrically connected to the electrical component and the circuit pattern, and electrically insulated from the metal core; and
   a heat radiation portion which is provided on the metal core to be exposed from the case, and electrically insulated from the electrical connection portion.

2. The electrical connection box as set forth in claim 1, wherein the heat radiation portion is integrally formed on a part of the metal core which is exposed from the insulation portion.

3. The electrical connection box as set forth in claim 1, wherein the heat radiation portion is connected to a part of the metal core which is exposed from the insulation portion.

4. The electrical connection box as set forth in claim 1, wherein the heat radiation portion is configured to be connectable to a heat radiation member.

5. An electrical connection box, comprising:
   a printed circuit board, on which an electrical component is mounted; and
   a case, covering the circuit board;
   the circuit board including:
   an electrical connection portion which is electrically connected to the electrical component;
   a plate-like metal core which is electrically insulated from the electrical connection portion and circuit pattern made of copper foil which is formed on the circuit board; and
   an insulation portion, covering a surface of the metal core; and
   wherein the metal core is provided with a heat radiation portion which is exposed from the case and electrically insulated from the electrical connection portion,
   wherein the heat radiation portion is configured to be connectable to a heat radiation member;
   wherein:
   the case includes a socket which is configured to be connectable to a connector;
   the heat radiation portion is disposed in the socket;
   the heat radiation member is disposed in the connector;
   the heat radiation member is connected to the heat radiation portion by connecting the connector to the socket so as to transfer heat from the heat radiation portion to the heat radiation member.

6. The electrical connection box as set forth in claim 1, wherein the heat radiation portion is not electrically coupled to the electrical connection portion.

7. The electrical connection box as set forth in claim 5, wherein the heat radiation portion is not electrically coupled to the electrical connection portion.

* * * * *